(12) United States Patent
Tzeng et al.

(10) Patent No.: US 7,050,914 B2
(45) Date of Patent: May 23, 2006

(54) CURRENT SENSING CIRCUIT

(75) Inventors: Guang-Nan Tzeng, Hsinchu (TW); Tien-Tzu Chen, Hsinchu (TW)

(73) Assignee: Aimtron Technology Corp., Hsinchu (TW)

( * ) Notice: Subject to any disclaimer, the term of this patent is extended or adjusted under 35 U.S.C. 154(b) by 12 days.

(21) Appl. No.: 10/904,078

(22) Filed: Oct. 22, 2004

(65) Prior Publication Data

US 2006/0089814 A1  Apr. 27, 2006

(51) Int. Cl.
*G01R 19/00* (2006.01)

(52) U.S. Cl. ........................ 702/64; 327/530; 327/534; 327/535; 327/540; 702/57; 702/68

(58) Field of Classification Search ............... None
See application file for complete search history.

(56) References Cited

U.S. PATENT DOCUMENTS

| | | | | |
|---|---|---|---|---|
| 5,027,004 A * | 6/1991 | Palara | ...................... | 327/109 |
| 5,635,823 A * | 6/1997 | Murakami et al. | .......... | 323/277 |
| 6,057,728 A * | 5/2000 | Igarashi | ...................... | 327/546 |
| 6,184,724 B1 * | 2/2001 | Lin | .............................. | 327/80 |
| 6,194,884 B1 * | 2/2001 | Kesler et al. | ................ | 323/285 |
| 6,198,315 B1 * | 3/2001 | Nakano | ...................... | 327/110 |
| 6,631,066 B1 * | 10/2003 | Smith et al. | ................. | 361/103 |
| 6,680,835 B1 * | 1/2004 | Tabata | .......................... | 361/79 |
| 6,791,368 B1 | 9/2004 | Tzeng et al. | | |
| 6,801,030 B1 | 10/2004 | Tai et al. | | |
| 2001/0009494 A1 * | 7/2001 | Umekawa | ................... | 361/93.9 |
| 2002/0031032 A1 * | 3/2002 | Ooishi | ......................... | 365/226 |
| 2002/0141126 A1 * | 10/2002 | Tabata | ........................ | 361/93.7 |
| 2002/0171455 A1 * | 11/2002 | Tsuchida et al. | ............ | 327/108 |
| 2004/0004470 A1 * | 1/2004 | Yoshida et al. | ............. | 323/284 |
| 2004/0075501 A1 * | 4/2004 | Takahashi et al. | .......... | 330/279 |
| 2004/0212432 A1 * | 10/2004 | Takahashi et al. | .......... | 330/279 |
| 2005/0094341 A1 * | 5/2005 | Hachiya | .................... | 361/93.1 |

* cited by examiner

Primary Examiner—Carol S. W. Tsai
(74) Attorney, Agent, or Firm—Winston Hsu

(57) ABSTRACT

A voltage detection unit generates a detection voltage signal representative of a potential difference caused by a current to be detected. A reference current generation unit generates a first reference current and a second reference current having a linear relationship therebetween. In response to the detection voltage signal and the first reference current, a transfer unit determines a first operation voltage. Furthermore, the transfer unit determines a second operation voltage and a transfer current in response to the first operation voltage and the second reference current. The second operation voltage is substantially equal to the first operation voltage. A detection current signal having a linear relationship with the current to be detected is generated through subtracting at least the second reference current from the transfer current.

20 Claims, 6 Drawing Sheets

CURRENT SENSING CIRCUIT

BACKGROUND OF THE INVENTION

1. Field of the Invention

The present invention relates to a current sensing circuit and, more particularly, to a current sensing circuit for detecting a current flowing through a high-voltage/large-current power switch.

2. Description of the Related Art

For a synchronous switching DC/DC voltage regulator, an inductor current needs to be detected in magnitude and variation if a current-mode topology is configured as a mechanism of feedback control. Conventionally, a resistor is connected in series to the inductor and then a potential difference is caused across the resistor by the inductor current, which will provide the appropriate information regarding the magnitude and variation of the inductor current. However, the prior art must utilize the series-connected resistor with a result of the $I^2R$ power consumption. In an application of a large inductor current, the series-connected resistor must occupy a large surface area for satisfying the required current flow capacity under limitations determined by the nature of the semiconductor processing and materials, setting up a barrier to the development of a finer semiconductor chip. Moreover, an operational amplifier is necessary for retrieving the potential difference across the series-connected resistor, making the circuitry more complicated and reducing the operation speed.

FIG. 1 is a circuit block diagram showing a synchronous switching DC/DC voltage regulator provided with a conventional current sensing circuit. As shown in the figure, a high-side switch HS and a low-side switch LS are coupled in series between an input voltage source $V_{in}$ and a ground potential. An inductor L has one terminal coupled to a node A between the high-side switch HS and the low-side switch LS, and the other terminal serving as an output terminal for supplying a regulated output voltage $V_{out}$. The output terminal may also be provided with an output capacitor $C_o$ for filtering ripples of the output voltage $V_{out}$. The high-side switch HS and the low-side switch LS are controlled by a high-side drive signal HD and a low-side drive signal LD, respectively, from a current-mode synchronous-switch control circuit 11. In the synchronous switching DC/DC voltage regulator, the high-side switch HS and the low-side switch LS are operated out of phase. When the high-side switch HS is turned ON and the low-side switch is turned OFF, the input voltage source $V_{in}$ supplies energy to the inductor L, causing the inductor current $I_L$ to gradually increase. On the other hand, when the high-side switch HS is turned OFF and the low-side switch LS is turned ON, the energy stored in the inductor L is delivered to the output terminal as the output voltage $V_{out}$, causing the inductor current $I_L$ to gradually decrease.

Therefore, in a case that the high-side switch HS is implemented by a PMOS transistor and the low-side switch LS is implemented by an NMOS transistor, the high-side drive signal HD and the low-side drive signal LD are the pulse trains with the same phase. In a case that both of the high-side switch HS and the low-side switch LS are implemented by NMOS transistors, the high-side drive signal HD and the low-side drive signal LD are the pulse trains with 180 degrees out of phase therebetween. In addition, the high-side drive signal HD and the low-side drive signal LD are designed as non-overlapping pulse trains with a turn-on delay for preventing the high-side switch HS and the low-side switch LS from being simultaneously turned ON to erroneously short-circuit the input voltage source $V_{in}$ and the ground potential.

For the current-mode feedback control mechanism, a resistor $R_s$ is coupled in series to the inductor L for detecting the magnitude and variation of the inductor current $I_L$. An operational amplifier 12 retrieves a potential difference across the series-connected resistor $R_s$ caused by the inductor current $I_L$, for generating a detection voltage $V_s$ representative of the inductor current $I_L$. Subsequently, the detection voltage $V_s$ generated by the operational amplifier 12 is fed back to the current-mode synchronous-switch control circuit 11 for performing the current-mode control.

The series-connected resistor $R_s$ is necessary in the prior art for detecting the inductor current $I_L$, resulting in the $I_L^2R_s$ power consumption. In an application where the inductor current $I_L$ should be made large, the series-connected resistor $R_s$ must occupy a large surface area for satisfying the required current flow capacity under limitations determined by the nature of the semiconductor processing and materials. Moreover, the operational amplifier 12 for retrieving the potential difference across the series-connected resistor $R_s$ makes the circuitry more complicated and reduces the operation speed.

SUMMARY OF THE INVENTION

In view of the above-mentioned problems, an object of the present invention is to provide a current sensing circuit capable of reducing the power consumption for detecting a current.

Another object of the present invention is to provide a current sensing circuit capable of being constructed by circuit components with a fine size.

Still another object of the present invention is to provide a current sensing circuit capable of enhancing the operational speed of the current detection.

The present invention provides a current sensing circuit to replace the conventional series-connected resistor and the operational amplifier. The inventors firstly observe that a current flowing through the high-side switch when the high-side switch is turned ON is identical to the inductor current, and the current flowing through the high-side switch produces a potential difference across a high-side switch-channel resistance, i.e. a drain-source conductive resistance $R_{ds(ON)}$. Therefore, the current sensing circuit according to the present invention directly detects the potential difference across the high-side switch-channel resistance, and then performs inventive voltage/current transformation to obtain a detection current having a linear relationship with the inductor current. The current sensing circuit according to the present invention overcomes the prior art disadvantages regarding the power consumption, size, and operation speed since none of the conventional series-connected resistor and the operational amplifier is needed. Furthermore, the current detection circuit according to the present invention is operated in synchronization with the high-side switch for saving the current-detecting power consumption.

According to one aspect of the present invention, a current sensing circuit includes a voltage detection unit, a reference current generation unit, and a transfer unit. The voltage detection unit generates a detection voltage signal representative of a potential difference caused by a current to be detected. The reference current generation unit generates a first reference current and a second reference current. A first linear relationship is established between the first and the second reference currents. The transfer unit is coupled between the voltage detection unit and the reference current generation unit. In response to the detection voltage signal and the first reference current, the transfer unit determines a first operation voltage. In response to the first operation voltage and the second reference current, the transfer unit determines a second operation voltage and a transfer current. The second operation voltage is substantially equal to the first operation voltage. A detection current signal is generated by subtracting at least the second reference current from the transfer current. A second linear relationship is established between the detection current signal and the current to be detected.

Preferably, the current sensing circuit further includes a voltage feedback control unit, coupled to the transfer unit, for reflecting a variation of the first operation voltage on the second operation voltage.

Preferably, the current sensing circuit further includes a current level shift unit, coupled to the transfer unit or the voltage feedback control unit, for adjusting a direct current level of the detection current signal.

According to another aspect of the present invention, a method of sensing a current includes the following steps. A detection voltage signal is generated to be representative of a potential difference caused by a current to be detected. A first reference current is generated. A second reference current is generated such that a first linear relationship is established between the first and the second reference currents. A first operation voltage is determined in response to the detection voltage signal and the first reference current. A second operation voltage and a transfer current are determined in response to the first operation voltage and the second reference current such that the second operation voltage is substantially equal to the first operation voltage. A detection current signal is generated by subtracting at least the second reference current from the transfer current such that a second linear relationship is established between the detection current signal and the current to be detected.

Preferably, the method of sensing the current further includes a step of reflecting a variation of the first operation voltage on the second operation voltage through a voltage feedback control.

Preferably, the method of sensing the current further includes a step of adjusting a direct current level of the detection current signal.

BRIEF DESCRIPTION OF THE DRAWINGS

The above-mentioned and other objects, features, and advantages of the present invention will become apparent with reference to the following descriptions and accompanying drawings, wherein.

DETAILED DESCRIPTION OF THE PREFERRED EMBODIMENTS

The preferred embodiments according to the present invention will be described in detail with reference to the drawings.

Figure 1:
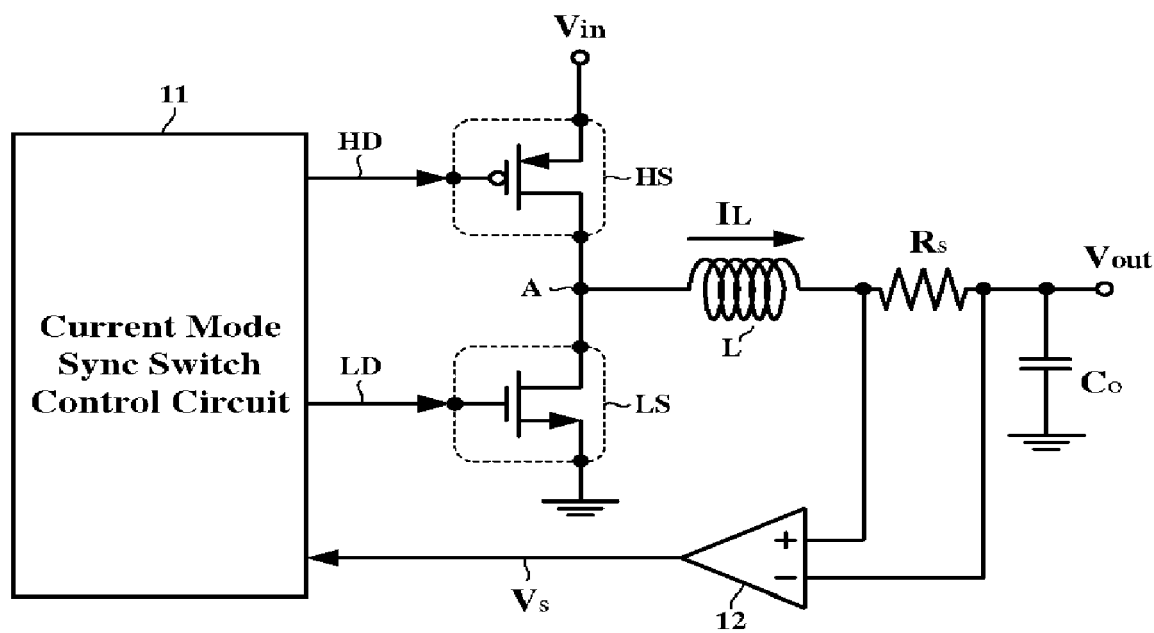
FIG. 1 is a circuit block diagram showing a synchronous switching DC/DC voltage regulator provided with a conventional current sensing circuit.
Figure 2:
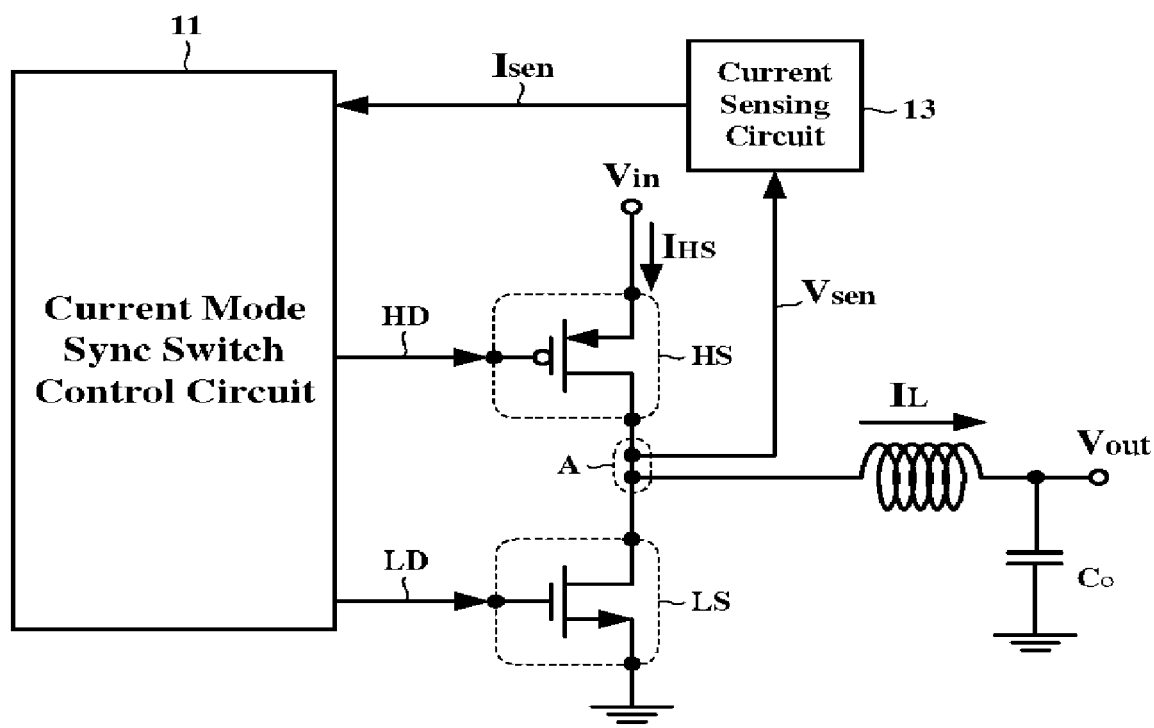
FIG. 2 is a circuit block diagram showing a synchronous switching DC/DC voltage regulator provided with a current sensing circuit according to the present invention.

FIG. 2 is a circuit block diagram showing a synchronous switching DC/DC voltage regulator provided with a current sensing circuit 13 according to the present invention. Referring to FIG. 2, a high-side switch HS is connected between an input voltage source Vin and a node A while a low-side switch LS is connected between the node A and a ground potential. An inductor L is connected between the node A and an output terminal. The inventors firstly observe that a channel current IHS flowing through the high-side switch HS when the high-side switch HS is turned ON is identical to an inductor current IL, and the high-side switch-channel current $I_{HS}$ produces a potential difference across the high-side switch-channel resistance RHS:

$$V_{in} - V_{sen} = I_{HS} \cdot R_{HS}$$

Therefore, the current sensing circuit 13 according to the present invention directly detects the potential difference ($V_{in} - V_{sen}$) across the high-side switch-channel resistance $R_{HS}$, and then performs inventive voltage/current transformation to obtain a detection current signal $I_{sen}$ having a linear relationship with the inductor current $I_L$. The current sensing circuit 13 according to the present invention overcomes the prior art disadvantages regarding the power consumption, size, and operation speed since none of the series-connected resistor $R_s$ and the operational amplifier 12 is needed. Furthermore, the current detection circuit 13 according to the present invention activates to detect the current when the high-side switch HS is turned ON and stops detecting when the high-side switch HS is turned OFF, for saving the current-detecting power consumption.

Figure 3:
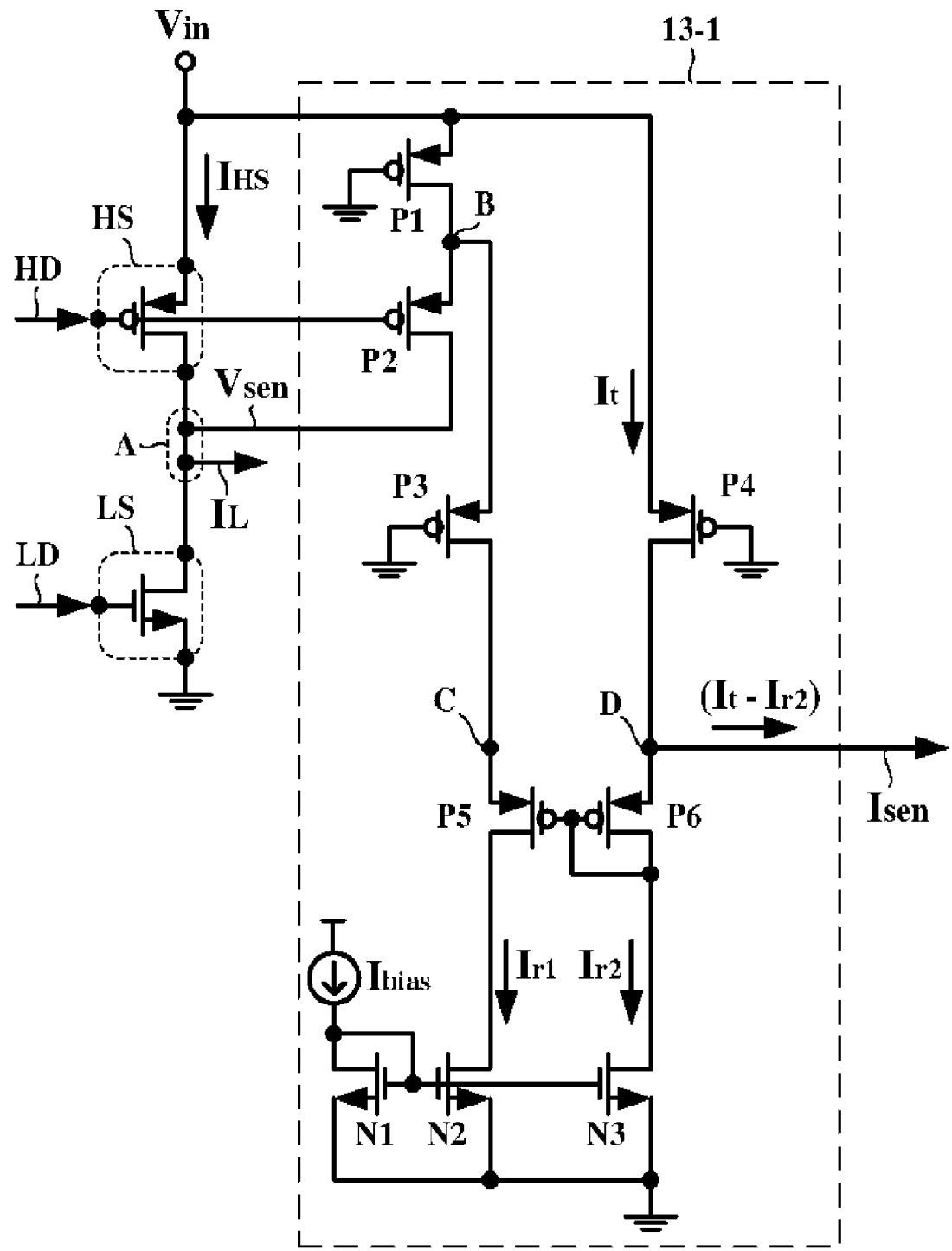
FIG. 3 is a detailed circuit diagram showing a current sensing circuit of a first embodiment according to the present invention.

FIG. 3 is a detailed circuit diagram showing a current sensing circuit 13-1 of a first embodiment according to the present invention. The current sensing circuit 13-1 includes a voltage detection unit (P1, P2), a reference current generation unit ($I_{bias}$, N1, N2, N3), and a transfer unit (P3, P4, P5, P6).

More specifically, the voltage detection unit is used for detecting the potential difference across the high-side switch-channel resistance $R_{HS}$. Assumed that the high-side switch-channel resistance is $R_{HS}$ and the channel current flowing through the high-side switch HS is $I_{HS}$, the potential difference $V_{ds}$ between the drain and source of the high-side switch HS may be expressed as:

$$V_{ds} = V_{in} - V_{sen} = I_{HS} \cdot R_{HS}$$

In the embodiment shown in FIG. 3, the voltage detection unit is implemented by PMOS transistors P1 and P2. The transistor P1 has a source connected to the input voltage source $V_{in}$, a gate connected to the ground potential, and a drain connected to a source (i.e. node B) of the transistor P2. The transistor P2 has a gate connected to a gate of the high-side switch HS, and a drain connected to a drain of the high-side switch HS. When a high-side drive signal HD turns ON the high-side switch HS, both of the transistors P1 and P2 are operated in the triode region and therefore become equivalent to channel resistances. Assumed that the transistor P1 has a channel resistance $R_{P1}$ and the transistor P2 has a channel resistance $R_{P2}$, the voltage $V_B$ at the node B may be expressed as a division of the potential difference since the series-coupled transistors P1 and P2 form a resistive voltage divider:

$$V_B = \frac{R_{P2} \cdot V_{in} + R_{P1} \cdot V_{sen}}{R_{P1} + R_{P2}}$$

For preventing the current sensing circuit 13-1 according to the present invention from influencing the original characteristics of the circuit to be detected, the voltage detection unit is designed to have a high impedance. Consequently, the channel resistances $R_{P1}$ and $R_{P2}$ of the transistors P1 and P2 are designed to be extremely larger than the channel resistance $R_{HS}$ of the high-side switch HS:

$$R_{P1} + R_{P2} \gg R_{HS}$$

In this case, the current flowing through the transistors P1 and P2 can be neglected in comparison with the high-side switch-channel current $I_{HS}$. As a result, during the ON period of the high-side switch HS, the high-side switch-channel current $I_{HS}$ appropriately indicates the inductor current $I_L$ even under the detection of the current detection circuit 13-1:

$$I_L \approx I_{HS}$$

In other words, although the current sensing circuit 13-1 according to the present invention detects in practice the high-side switch-channel current $I_{HS}$, it may be said in circuit application that the inductor current $I_L$ is detected.

The reference current generation unit is used for supplying a first reference current $I_{r1}$ and a second reference current $I_{r2}$ such that a linear relationship is established between the first reference current $I_{r1}$ and the second reference current $I_{r2}$:

$$I_{r1} = K \cdot I_{r2}$$

where K is a proportional constant larger than or equal to 1. In the embodiment shown in FIG. 3, the reference current generation unit includes a bias current source $I_{bias}$ and three NMOS transistors N1, N2, and N3. The transistor N1 has a drain connected to the bias current source $I_{bias}$, a gate connected to its own drain, and a source connected to the ground potential. The transistor N2 has a gate connected to the gate of the transistor N1, a source connected to the ground potential, and a drain for allowing the first reference current $I_{r1}$ to sink or flow. The transistor N3 has a gate connected to the gate of the transistor N1, a source connected to the ground potential, and a drain for allowing the second reference current $I_{r2}$ to sink or flow. The transistors N1, N2, and N3 together form a multiple-output-stage current mirror having the transistors N2 and N3 as independent current output stages. If the transistors N2 and N3 are identically manufactured except the width-to-length ratio of the gate is designed under the following condition:

$$(W/L)_{N2} = K \cdot (W/L)_{N3}$$

then the first reference current $I_{r1}$ and the second reference current $I_{r2}$ can effectively establish the desired linear relationship:

$$\frac{I_{r1}}{I_{r2}} = \frac{(W/L)_{N2}}{(W/L)_{N3}} = K$$

The transfer unit is coupled between the voltage detection unit and the reference current generation unit for transferring the detection voltage signal $V_B$ generated from the voltage detection unit into the desired detection current signal $I_{sen}$ in accordance with the first and second reference currents $I_{r1}$ and $I_{r2}$ generated from the reference current generation unit. In the embodiment shown in FIG. 3, the transfer unit includes four PMOS transistors P3, P4, P5, and P6. The transistor P3 has a source connected to the node B, a gate connected to the ground potential, and a drain connected to a node C. Consequently, the transistor P3 is operated in the triode region as an equivalent channel resistance $R_{P3}$. The transistor P4 has a source connected to the input voltage source $V_{in}$, a gate connected to the ground potential, and a drain connected to a node D. Consequently, the transistor P4 is operated in the triode region as an equivalent channel resistance $R_{P4}$. Moreover, the transistor P5 has a source connected to the node C while the transistor P6 has a source connected to the node D. The transistors P5 and P6 have their gates connected together and the gate of the transistor P6 is further connected to its own drain. Therefore, the transistors P5 and P6 form a current mirror. The transistor P5 has a drain connected to the drain of the transistor N2 for allowing the first reference current $I_{r1}$ to flow through the transistors P3 and P5. The transistor P6 has a drain connected to the drain of the transistor N3 for allowing the second reference current $I_{r2}$ to flow through the transistor P6.

Since the linear relationship with the proportional constant K is established between the first and second reference currents $I_{r1}$ and $I_{r2}$, the width-to-length ratios of the transistors P5 and P6 must be designed to satisfy the following condition:

$$(W/L)_{P5} = K \cdot (W/L)_{P6}$$

for allowing the first and second reference currents $I_{r1}$ and $I_{r2}$ to smoothly flow through the transistors P5 and P6, respectively, given that the transistors P5 and P6 are otherwise identically manufactured.

Because the first reference current $I_{r1}$ also flows through the transistor P3, a voltage $V_C$ at the node C may be expressed as:

$$V_C = V_B - I_{r1} \cdot R_{P3}$$
$$= V_{in} - (V_{in} - V_B) - I_{r1} \cdot R_{P3}$$
$$= V_{in} - \frac{R_{P1}}{R_{P1} + R_{P2}} \cdot (V_{in} - V_{sen}) - I_{r1} \cdot R_{P3}$$
$$= V_{in} - \frac{R_{P1}}{R_{P1} + R_{P2}} \cdot I_{HS} \cdot R_{HS} - I_{r1} \cdot R_{P3}$$

Now assumed that a transfer current $I_t$ flows though the transistor P4, a voltage $V_D$ at the node D may be expressed as:

$$V_D = V_{in} - I_t \cdot R_{P4}$$

As described above, because the transistors P5 and P6 are coupled as the current mirror and the first and second reference currents $I_{r1}$ and $I_{r2}$ correspondingly follow the width-to-length ratios $(W/L)_{P5}$ and $(W/L)_{P6}$, the gate-source voltage $V_{GS(P5)}$ of the transistor P5 is operated equal to the gate-source voltage $V_{GS(P6)}$ of the transistor P6. In this case, since the gates of the transistors P5 and P6 are coupled together, the voltage at the source of the transistor P5 (i.e. the voltage $V_C$ at the node C) is equal to the voltage at the source of the transistor P5 (i.e. the voltage $V_D$ at the node D):

$$V_C = V_D \Rightarrow$$

$$V_{in} - \frac{R_{P1}}{R_{P1}+R_{P2}} \cdot I_{HS} \cdot R_{HS} - I_{r1} \cdot R_{P3} = V_{in} - I_t \cdot R_{P4} \Rightarrow$$

$$I_t = \frac{R_{P1}}{R_{P4} \cdot (R_{P1}+R_{P2})} \cdot I_{HS} \cdot R_{HS} + \frac{R_{P3}}{R_{P4}} \cdot I_{r1}$$

$$= \frac{R_{P1}}{R_{P4} \cdot (R_{P1}+R_{P2})} \cdot I_{HS} \cdot R_{HS} + \frac{R_{P3}}{R_{P4}} \cdot K \cdot I_{r2}$$

$$\equiv \Omega \cdot I_{HS} + \Phi \cdot I_{r2}$$

$$\Omega \equiv \frac{R_{P1} \cdot R_{HS}}{R_{P4} \cdot (R_{P1}+R_{P2})}$$

$$\Phi \equiv \frac{R_{P3}}{R_{P4}} \cdot K$$

Therefore, the detection current signal $I_{sen}$ output from the node D may be expressed as:

$$I_{sen} = I_t - I_{r2}$$

$$= \Omega \cdot I_{HS} + (\Phi - 1) \cdot I_{r2}$$

Since the proportional constants $\Omega$ and $\Phi$ and the second reference current $I_{r2}$ are predetermined parameters and characteristic during the circuit design procedure, the current sensing circuit 13-1 according to the present invention effectively outputs the detection current signal $I_{sen}$ having the listed-above linear relationship with the high-side switch-channel current $I_{HS}$. Since the high-side switch-channel current $I_{HS}$ is substantially equal to the inductor current $I_L$, the current sensing circuit 13-1 according to the present invention achieves a precise measurement of the inductor current $I_L$.

In one embodiment of the present invention, the channel resistances $R_{P3}$ and $R_{P4}$ of the transistors P3 and P4 may be designed with the same value, and the transistors P5 and P6 are also designed with the same width-to-length ratio such that the proportional constant K becomes equal to 1, thereby making the value of the proportional constant $\phi$ equal to 1. In this case, the detection current signal $I_{sen}$ is further reduced to be directly in proportion to the high-side switch-channel current $I_{HS}$:

$$I_{sen} = \Omega \cdot I_{HS}$$

Figure 4:
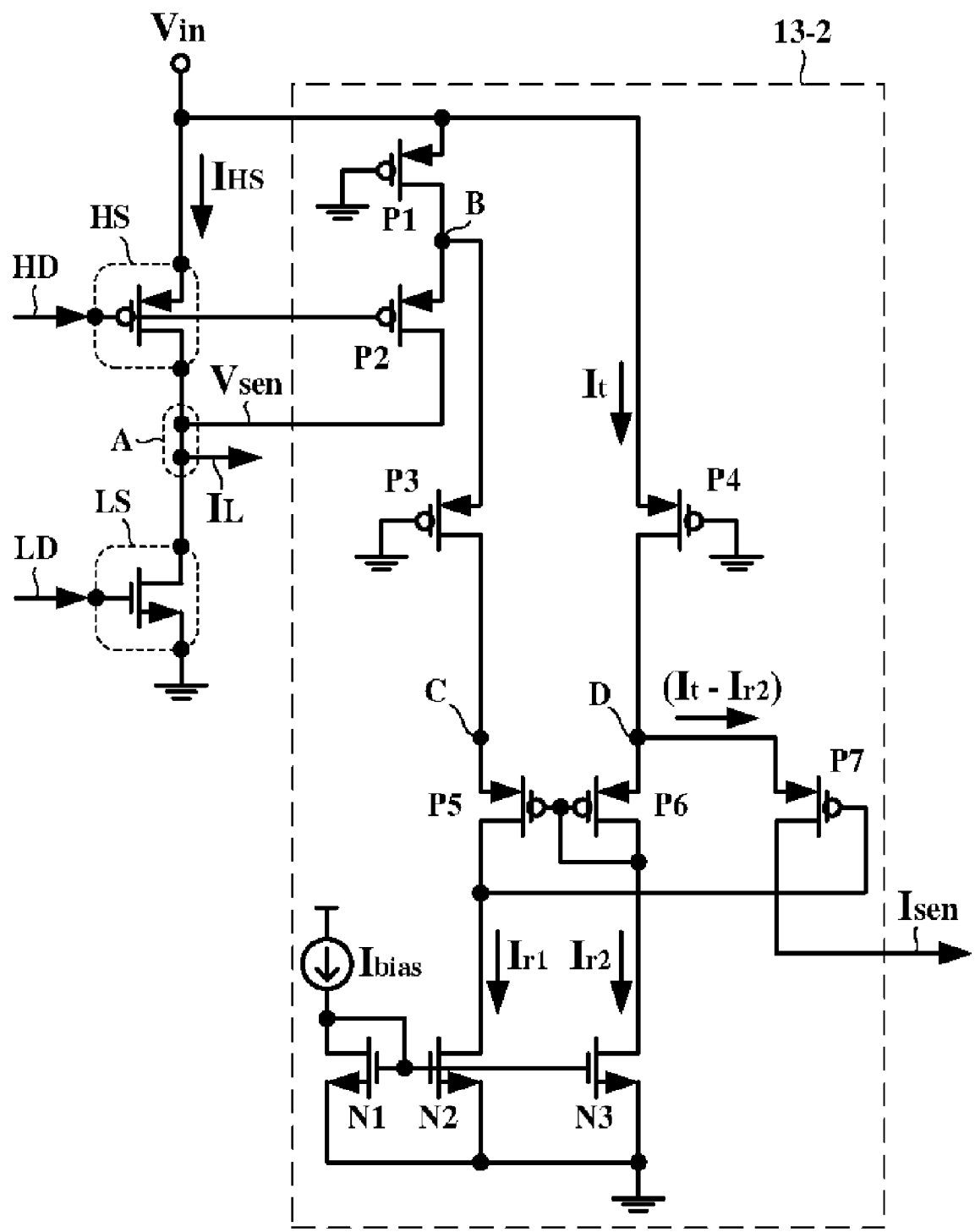
FIG. 4 is a detailed circuit diagram showing a current sensing circuit of a second embodiment according to the present invention.

FIG. 4 is a detailed circuit diagram showing a current sensing circuit 13-2 of a second embodiment according to the present invention. As seen by comparing with FIGS. 3 and 4, the second embodiment is different from the first embodiment in that the current sensing circuit 13-2 of the second embodiment is further provided with a voltage feedback control unit (P7) for rapidly reflecting the variation of the detection voltage signal $V_B$ in order to ensure a stable operation of the current sensing circuit 13-2 and a precise detection current signal $I_{sen}$.

In the second embodiment shown in FIG. 4, the voltage feedback control unit includes a PMOS transistor P7 having a gate connected to the drain of the transistor P5, a source connected to the source of the transistor P6, and a drain for outputting the desired detection current signal $I_{sen}$. When the high-side switch-channel current $I_{HS}$ increases (or decreases), the voltage $V_{sen}$ at the node A decreases (or increases) such that a corresponding fall (or rise) happens to the detection voltage signal $V_B$ at the node B. As a result, the voltage at the source of the transistor P5 (i.e. the voltage $V_C$ at the node C) and the voltage at the drain of the transistor P5 simultaneously decrease (or increase) with the same magnitude. Through the feedback control provided by the transistor P7, the variation of the voltage at the drain of the transistor P5 rapidly causes the same magnitude of variation to the voltage at the source of the transistor P6 (i.e. the voltage $V_D$ at the node D). Consequently, the voltage $V_D$ at the node D rapidly reflects the variation of the voltage $V_C$ at the node C, thereby maintaining the equality therebetween to ensure the stable operation of the current sensing circuit 13-2 and the precise detection current signal $I_{sen}$.

Figure 5:
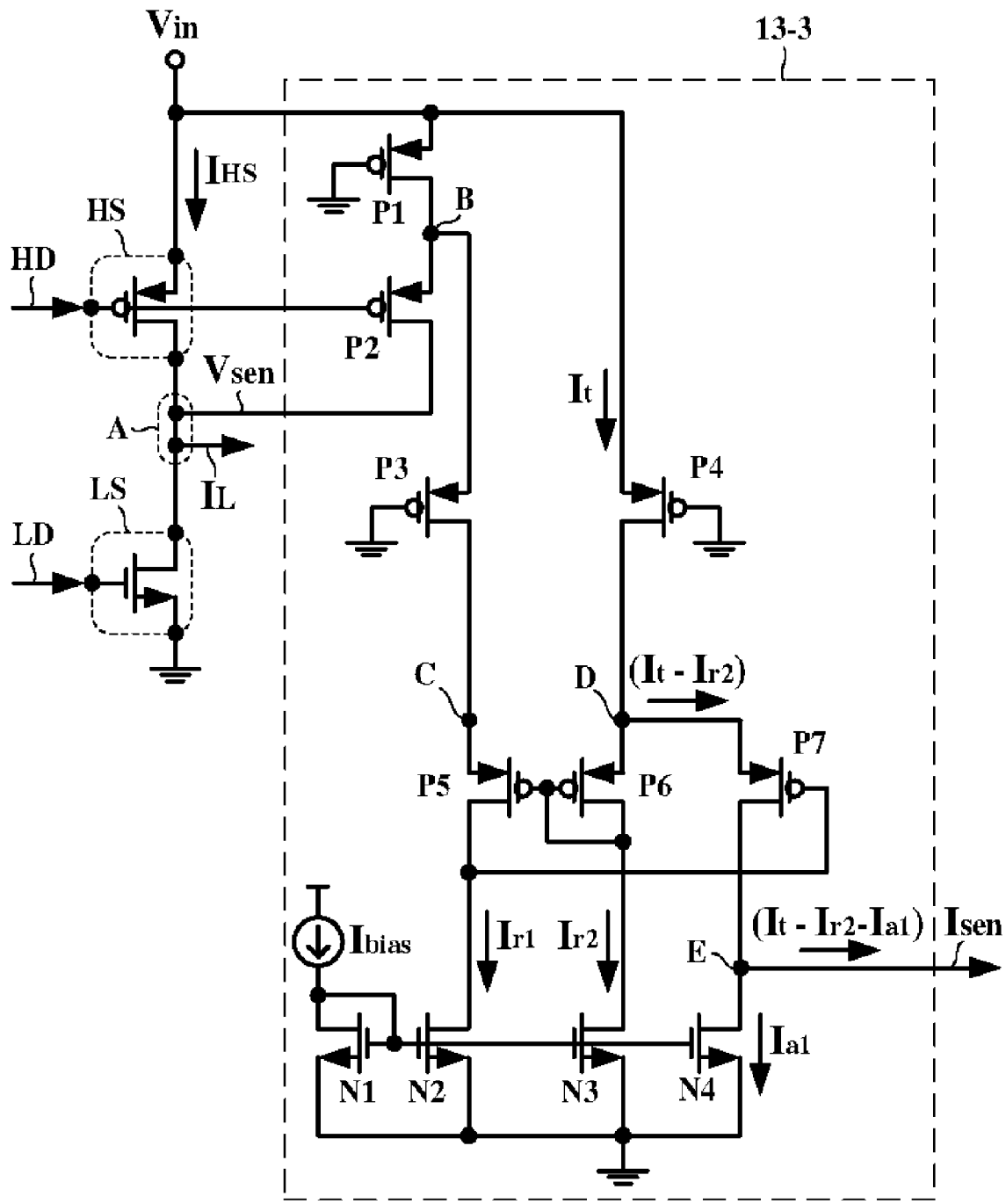
FIG. 5 is a detailed circuit diagram showing a current sensing circuit of a third embodiment according to the present invention.

FIG. 5 is a detailed circuit diagram showing a current sensing circuit 13-3 of a third embodiment according to the present invention. As seen by comparing with FIGS. 4 and 5, the third embodiment is different from the second embodiment in that the current sensing circuit 13-3 of the third embodiment is further provided with a current level shift unit (N4) for adjusting a direct current level of the detection current signal $I_{sen}$ so as to produce a predetermined current offset thereon for facilitating the circuit application or design.

In the third embodiment shown in FIG. 5, the current level shift unit includes an NMOS transistor N4 having a gate connected to the gate of the transistor N1, a source connected to the ground potential and a drain connected to the drain of the transistor P7 (i.e. node E) for allowing a shift current $I_{a1}$ to sink or flow. Therefore, the detection current signal $I_{sen}$ output from the node E has a direct current level adjusted in accordance with the shift current $I_{a1}$:

$$I_{sen} = I_t - I_{r2} - I_{a1}$$

$$= \Omega \cdot I_{HS} + (\Phi - 1) \cdot I_{r2} - I_{a1}$$

If the shift current $I_{a1}$ is preset equal to $(\Phi-1)I_{r2}$, the detection current signal $I_{sen}$ is reduced to be directly in proportion to the high-side switch-channel current $I_{HS}$:

$$I_{sen} = \Omega \cdot I_{HS}$$

Figure 6:
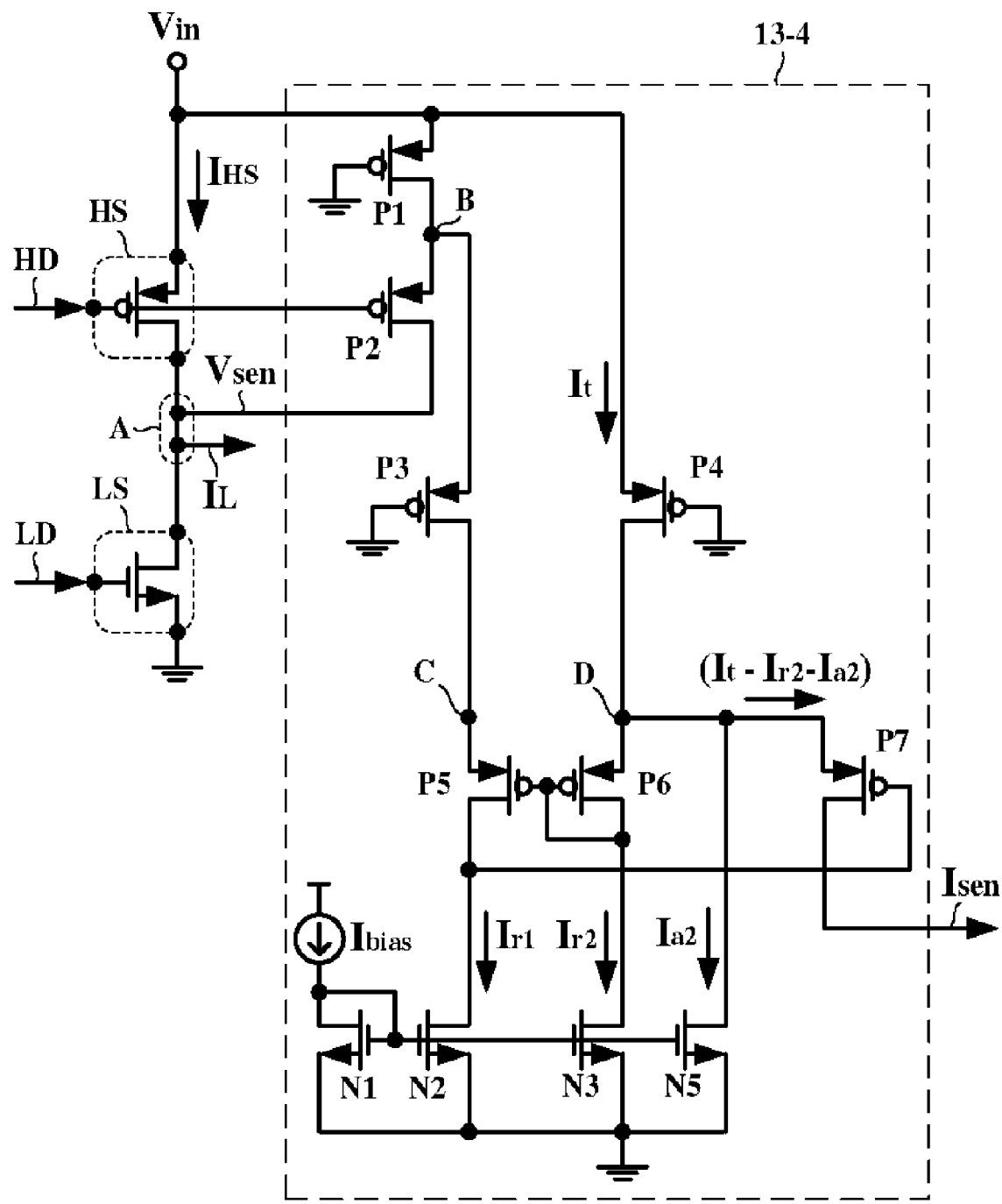
FIG. 6 is a detailed circuit diagram showing a current sensing circuit of a fourth embodiment according to the present invention.

FIG. 6 is a detailed circuit diagram showing a current sensing circuit 13-4 of a fourth embodiment according to the present invention. As seen by comparing with FIGS. 4 and 6, the fourth embodiment is different from the second embodiment in that the current sensing circuit 13-4 of the fourth embodiment is further provided with a current level shift unit (N5) for adjusting a direct current level of the detection current signal $I_{sen}$ so as to produce a predetermined current offset for facilitating the circuit application or design.

In the fourth embodiment shown in FIG. 6, the current level shift unit includes an NMOS transistor N5 having a gate connected to the gate of the transistor N1, a source connected to the ground potential, and a drain connected to the source of the transistor P7 (i.e. node D) for allowing a shift current $I_{a2}$ to sink or flow. Therefore, the detection current signal $I_{sen}$ output from the drain of the transistor P7 has a direct current level adjusted in accordance with the shift current $I_{a2}$:

$$I_{sen} = I_t - I_{r2} - I_{a2}$$
$$= \Omega \cdot I_{HS} + (\Phi - 1) \cdot I_{r2} - I_{a2}$$

If the shift current $I_{a2}$ is preset equal to $(\Phi-1)I_{r2}$, the detection current signal $I_{sen}$ is reduced to be directly in proportion to the high-side switch-channel current $I_{HS}$:

$$I_{sen} = \Omega \cdot I_{HS}$$

To sum up, the current sensing circuit according to the present invention directly detects the potential difference across the high-side switch-channel resistance, and then performs the inventive voltage/current transformation to obtain the detection current signal having the linear relationship with the inductor current. The current sensing circuit according to the present invention overcomes the prior art disadvantages regarding the power consumption, size, and operation speed since none of the conventional series-connected resistor and the operational amplifier is needed. Furthermore, the current detection circuit according to the present invention is operated in synchronization with the high-side switch for saving the current-detecting power consumption.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A current sensing circuit comprising:
a voltage detection unit for generating a detection voltage signal representative of a potential difference caused by a current to be detected;
a reference current generation unit for generating a first reference current and a second reference current such that a first linear relationship is established between the first and the second reference currents; and
a transfer unit coupled between the voltage detection unit and the reference current generation unit for determining a first operation voltage in response to the detection voltage signal and the first reference current, and for determining a second operation voltage and a transfer current in response to the first operation voltage and the second reference current such that the second operation voltage is substantially equal to the first operation voltage and a detection current signal is generated by subtracting at least the second reference current from the transfer current, wherein:
a second linear relationship is established between the detection current signal and the current to be detected.

2. The circuit according to claim 1, wherein:
the voltage detection unit is implemented by a resistive voltage divider such that the detection voltage signal is a division of the potential difference.

3. The circuit according to claim 1, wherein:
the potential difference is caused across a switching device through which the current to be detected flows, and
the voltage detection unit activates to generate the detection voltage signal when the switching device is turned ON and stops generating the detection voltage signal when the switching device is turned OFF.

4. The circuit according to claim 3, wherein:
the voltage detection unit comprises:
a first transistor for operating as a first channel resistance, and
a second transistor for operating as a second channel resistance when the switching device is turned ON and for operating as an open-circuit when the switching device is turned OFF, wherein:
the first and the second transistors are coupled to the switching device such that the detection voltage signal is a division of the potential difference.

5. The circuit according to claim 1, wherein:
the reference current generation unit comprises:
a bias current source for supplying a constant bias current, and
a multiple-output-stage current mirror coupled to the bias current source for generating the first and the second reference currents based on the constant bias current.

6. The circuit according to claim 1, wherein:
the first reference current is larger than or equal to the second reference current.

7. The circuit according to claim 1, wherein:
the transfer unit comprises:
a first resistive device having a first terminal and a second terminal, the first terminal receiving the detection voltage signal, and
a first transistor coupled between the second terminal of the first resistive device and the reference current generation unit such that the first reference current flows through the first transistor, wherein:
the first reference current further flows through the first resistive device such that the first operation voltage is determined by a voltage across a gate and a source of the first transistor.

8. The circuit according to claim 7, wherein:
the first resistive device is implemented by a transistor-channel resistance.

9. The circuit according to claim 7, wherein:
the transfer unit further comprises:
a second resistive device having a first terminal and a second terminal, the first terminal receiving an input voltage source, and
a second transistor coupled between the second terminal of the second resistive device and the reference current generation unit such that the second reference current flows through the second transistor, wherein:
the second operation voltage is determined by a voltage across a gate and a source of the second transistor, and the transfer current flows through the second resistive device.

10. The circuit according to claim 9, wherein:
the second resistive device is implemented by a transistor-channel resistance.

11. The circuit according to claim 9, further comprising:
a voltage feedback control unit coupled between the first and the second transistors for reflecting a variation of the first operation voltage on the second operation voltage.

12. The circuit according to claim 11, wherein:
the voltage feedback control unit is implemented by a third transistor having a gate, a source, and a drain such that the gate is controlled by the first transistor, the source is coupled to the second transistor, and the detection current signal is output from the drain.

13. The circuit according to claim 1, further comprising:
a voltage feedback control unit coupled to the transfer unit for reflecting a variation of the first operation voltage on the second operation voltage.

14. The circuit according to claim 13, further comprising:
a current level shift unit coupled to the voltage feedback control unit for adjusting a direct current level of the detection current signal.

15. The circuit according to claim 1, further comprising:
a current level shift unit coupled to the transfer unit for adjusting a direct current level of the detection current signal.

16. A method of sensing a current comprising:
generating a detection voltage signal representative of a potential difference caused by a current to be detected;
generating a first reference current;
generating a second reference current such that a first linear relationship is established between the first and the second reference currents;
determining a first operation voltage in response to the detection voltage signal and the first reference current;
determining a second operation voltage and a transfer current in response to the first operation voltage and the second reference current such that the second operation voltage is substantially equal to the first operation voltage; and
generating a detection current signal by subtracting at least the second reference current from the transfer current such that a second linear relationship is established between the detection current signal and the current to be detected.

17. The method according to claim 16, further comprising:
reflecting a variation of the first operation voltage on the second operation voltage through a voltage feedback control.

18. The method according to claim 16, further comprising:
adjusting a direct current level of the detection current signal.

19. The method according to claim 16, wherein:
the potential difference is caused across a switching device through which the current to be detected flows.

20. The method according to claim 19, wherein:
the step of generating the detection voltage signal is performed when the switching device is turned ON and stopped when the switching device is turned OFF.

* * * * *